United States Patent
Hayashi et al.

(10) Patent No.: US 6,380,344 B1
(45) Date of Patent: Apr. 30, 2002

(54) CYANATE ESTER COMPOSITION AND CURED PRODUCT THEREOF

(75) Inventors: Toshiaki Hayashi; Nobuyuki Nakajima, both of Ibaraki (JP)

(73) Assignee: Sumitomo Chemical Company, Ltd., Osaka (JP)

( * ) Notice: Subject to any disclaimer, the term of this patent is extended or adjusted under 35 U.S.C. 154(b) by 0 days.

(21) Appl. No.: 09/309,267

(22) Filed: May 11, 1999

(30) Foreign Application Priority Data

May 13, 1998 (JP) .......................................... 10-130201

(51) Int. Cl.$^7$ ..................... C07C 261/02; C08F 283/00; C08G 59/40; C08G 59/68; C08L 63/04
(52) U.S. Cl. ........................ 528/124; 525/486; 560/301
(58) Field of Search ................................ 525/486, 526; 528/124; 560/301

(56) References Cited

U.S. PATENT DOCUMENTS

| | | | |
|---|---|---|---|
| 3,562,214 A | | 2/1971 | Kubens et al. |
| 4,361,623 A | * | 11/1982 | Newkirk et al. ......... 525/526 X |
| 4,661,553 A | * | 4/1987 | Hefner, Jr. ............. 525/526 X |
| 4,900,848 A | * | 2/1990 | Saito et al. ............ 525/526 X |
| 4,918,157 A | * | 4/1990 | Gardner et al. ......... 525/526 X |
| 4,931,496 A | * | 6/1990 | Qureshi et al. ......... 525/526 X |
| 5,284,968 A | * | 2/1994 | Craig, Jr. .................... 560/301 |
| 5,955,543 A | * | 9/1999 | Sachdev et al. ......... 525/486 X |

FOREIGN PATENT DOCUMENTS

| | | |
|---|---|---|
| EP | 0 301 787 A1 | 2/1989 |
| EP | 0 739 879 A1 | 10/1996 |
| JP | 46-41112 | 12/1971 |

OTHER PUBLICATIONS

Patent Abstracts of Japan, vol. 1998, No. 08, Jun. 30, 1998 & JP 10 077332 A (Sumitomo Chem Co Ltd), Mar. 24, 1998.
Patent Abstracts of Japan, vol. 1998, No. 02, Jan. 30, 1998 & JP 09 278882 A (Sumitomo Chem Co Ltd), Oct. 28, 1997.
Patent Abstracts of Japan, vol. 1996, No. 06, Jun. 28, 1996 & JP 08 034832 A (Sumitomo Chem Co Ltd), Feb. 6, 1996.

* cited by examiner

*Primary Examiner*—Richard D. Lovering
(74) *Attorney, Agent, or Firm*—Fitch, Even, Tabin & Flannery

(57) ABSTRACT

A cyanate ester-epoxy resin composition that can be cured to obtain a product which has excellent mechanical properties is provided. More particularly, a cyanate ester composition comprising (A) a cyanate ester in which the total content of impurities containing imino carbonates, alkyl cyanamides, partially substituted cyanates and phenols is 5% or less, or a prepolymer thereof and (B) an epoxy resin is provided.

17 Claims, No Drawings

CYANATE ESTER COMPOSITION AND CURED PRODUCT THEREOF

BACKGROUND OF THE INVENTION

1. Field of the Invention

The present invention relates to polyfunctional cyanate ester (herein-after, referred to as "cyanate ester") compositions providing a cured product which is excellent in mechanical properties, and to cured products thereof. The cyanate ester composition of the present invention is particularly useful as an encapsulating material, a material for laminated boards, a structure material and a paint material.

2. Description of the Related Art

A cyanate esters have been mainly used as insulation materials for printed circuit boards because of their high glass transition temperatures and low dielectric properties. In this case, the cyanate ester is usually modified with other components and used in a composition. Further, as a composition of a cyanate ester and an epoxy resin, Japanese Patent Publication (Kokoku) No.46-41112 has been known as providing one such modification method.

A cyanate ester is usually produced by a reaction of a poly-valent phenol with a cyanogen halide.

SUMMARY OF THE INVENTION

An object of the present invention is to provide a composition that is capable of producing a cured product which is excellent in mechanical properties, and a cured product thereof.

The present inventors have studied intensively and as a result, found that a cured product which is particularly excellent in mechanical properties is produced in combination with an epoxy resin by using a cyanate ester in which the total content of impurities containing imino carbonates, alkyl cyanamides, partially substituted cyanates and phenols is reduced to 5% or less, and thereby have completed the present invention.

The present invention relates to a cyanate ester composition, comprising (A) a cyanate ester in which the total content of imino carbonates, alkyl cyanamides, partially substituted cyanates and phenols as impurities is reduced to 5% or less, or a prepolymer thereof, and (B) an epoxy resin as essential components, and a cured product thereof.

DETAILED DESCRIPTION OF THE INVENTION

The present invention is illustrated in detail below.

The cyanate ester(A) used in the present invention is a cyanate ester in which the total content of imino carbonates, alkyl cyanamides, partially substituted cyanates and phenols as impurities is 5% or less.

The cyanate ester is a compound having at least two cyanate ester groups, with examples thereof including difunctional cyanate compounds such as 2,2-bis(4-cyanatophenyl)propane, 1,1-bis(4-cyanatophenyl)ethane, bis(4-cyanato-3,5-dimethylphenyl)methane, 1,3-bis(4-cyanatophenyl-1-(methylethylidene))benzene, bis(4-cyanatophenyl) thioether, bis(4-cyanatophenyl)ether and the like; and polyfunctional cyanate compounds derived from a phenol novolac, a cresol and the like, but the same is not limited thereto.

Any cyanate ester (A) in the present invention can be used, but a cyanate ester(A) derived from bisphenol A is preferable from the viewpoint of reactivity and heat resistance, in particular.

The cyanate ester used in the present invention may be used as it is, that is, as a monomer or as a prepolymer thereof.

Such a prepolymer can be obtained by heating the cyanate ester alone or in a mixture of 2 or more of the cyanate esters in a solvent or without a solvent at 50 to 200° C., or by heating them in a solvent or without a solvent at about 50 to 200° C. in the presence of a curing catalyst (C) as described below.

The cyanate ester used in the present invention has the total content of imino carbonates, alkyl cyanamides, partially substituted cyanates and phenols of 5% or less as impurities. Preferably the total content of all impurities is 5% or less. But, the impurities being maintained at the low total level of 5% or less may consist essentially of imino carbonates, alkyl cyanamides, partially substituted cyanates and phenols.

The cyanate ester can be obtained, for example, by carrying out a de-hydrohalogenation of a phenol as a raw material with a cyanogen halide represented by cyanogen chloride or cyanogen bromide in an appropriate solvent. However, the cyanate ester which is obtained by this method occasionally contains a remarkable amount of impurities depending on production conditions such as reaction temperature, solvent utilized and the like. Accordingly, when a compound is used in the present invention, the total content of imino carbonates, alkyl cyanamides and partially substituted cyanates(cyanate monoesters) as by-products and unreacted phenols in the cyanate ester is required to be 5% or less.

The content of the impurities can be reduced to be 5% or less, by properly selecting the kind of solvent used in a crystallization step and washing step after the synthesis of the cyanate ester. Further, the kind of a solvent differs depending upon the system of reaction and the kind of the cyanate ester being utilized.

The content, in other words, purity of the cyanate ester used in the present invention is determined by using a high speed liquid chromatography method (LC) or a gas chromatography method (GC). Contents were determined by the peak area ratio of respective components to the total peak area (set as 100) derived from the synthesized product of a chromatogram. Specific measurement conditions may be properly selected depending on the kind of the compound, and in LC, the content can be measured by changing the condition of a mobile phase, depending upon the kind of the compound used, for example among the conditions indicated in the Examples herein provided.

Any epoxy resins (B) in the present invention can be used, and epoxy resins obtained by any known processes can be also used.

There is illustratively mentioned a process which comprises reacting a phenol or its derivative with an epihalohydrin in the presence of an alkali such as sodium hydroxide or the like, as a common process for producing an epoxy resin, but the present invention is not limited thereto.

Examples of the epoxy resin include epoxy resins represented by the structural formula (1) or (2) below:

(1)

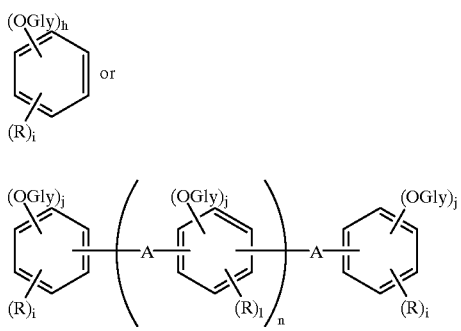

or (2)

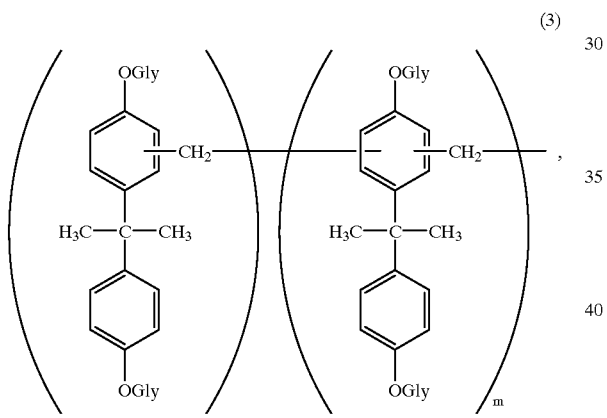

wherein, n is an average repeating number and represents a number of 0 to 10, h represents an integer of 1 to 3 (preferably 2 to 3), j represents an integer of 1 to 3, i represents zero or an integer of 1 to 4, l is zero or integer of 1 to 3, and each of the R groups independently represents a bromine atom, a chlorine atom, an alkyl group having 1 to 10 carbon atoms, a cycloalkyl group having 5 to 7 carbon atoms, a hydrocarbon group having 6 to 20 carbon atoms, which includes a cycloalkyl group having 5 to 7 carbon atoms, or a group represented by the structural formula (3) described below:

(3)

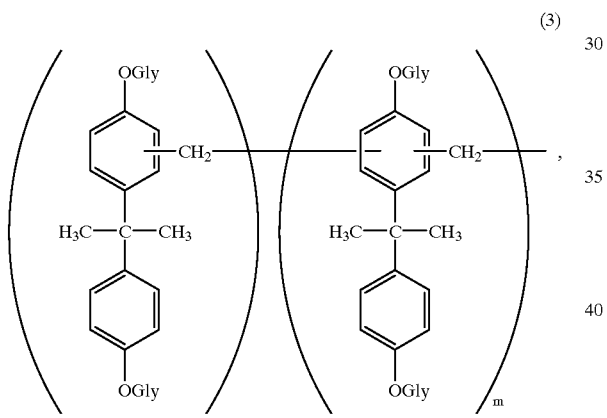

wherein m represents a number of 0 to 9, and each of the R groups may be the same or different when i is 2 or more, Gly represents a glycidyl group, and A represents any one of an oxygen atom, a sulfur atom, or a group represented by the structural formulae (4) to (14) below:

(4)

—CH$_2$—, (5)

—SO$_2$—, (6)

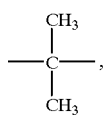

(7)

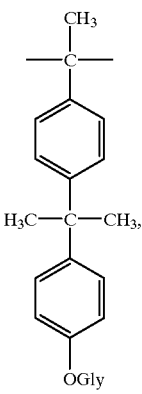

(8)

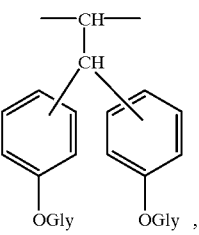

(9)

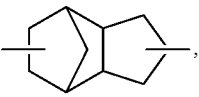

(10)

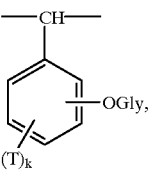

(11)

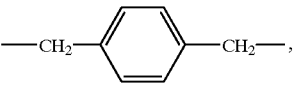

(12)

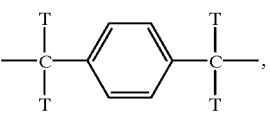

(13)

—CH=CH—, and (14)

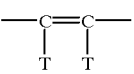

wherein each of the T groups represents independently an alkyl group having 1 to 10 carbon atoms, and k is zero or an integer of 1 to 4; and further epoxy resins represented by the structural formulae (15) and (16) described below,

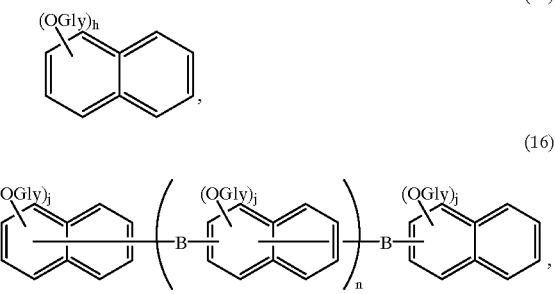

(15)

(16)

wherein h, j and n are as defined above, and B represents any one of the structural formula (4) as described above or the structural formula (17) below,

(17)

(wherein each of the U groups independently represents a halogen atom or an alkyl group having 1 to 10 carbon atoms, and T and i are as defined above)].

Examples of the epoxy resin represented by the above-mentioned structural formula (1) or (2) include difunctional epoxy resins derived from bisphenol A, tetrabromobisphenol A, bisphenol S, an alkyl-substituted dihydroxybiphenyl, dihydroxystilbene, an alkyl-substituted hydroquinone and the like; novolac type epoxy resins derived from a phenol novolac, a cresol novolac, a formaldehyde novolac of bisphenol A, a benzaldehyde novolac of phenol, an alkyl-substituted phenol, or the like; aralkyl type epoxy resins derived from phenol and terephthalaldehyde, an alkyl-substituted phenol and terephthalaldehyde, or the like; and epoxy resins derived from dicyclopentadiene or a dicyclopentadiene novolac.

Further, as the epoxy resin represented by the above-mentionedstructural formula (13) or (14), novolac type epoxy resins derived from a formaldehyde novolac of naphthol; and aralkyl type epoxy resins derived from naphthol and terephthalaldehyde, naphthol and an alkyl-substituted terephthalaldehyde, or the like can be exemplified. Moreover, mixtures of these epoxy resins can be exemplified. However, the epoxy resins are not limited thereto. The compounding ratio of the cyanate ester compound to the epoxy resin is properly selected, and usually from 1:99 to 99:1 (weight ratio). Further, the ratio is preferably 30:70 to 95:5, and more preferably 50:50 to 90:10, because with these weight ratios, there are obtained cured products which possess good and preferable properties in heat resistance and toughness.

It is possible to use a well-known flame retardant in combination when flame resistance is desired to be bestowed to a cured product, but the epoxy resin used in the present invention may be used in a form for bestowing the flame resistance by previously reacting a bromine-containing phenol or a bromine-containing epoxy resin. The flame resistance of the composition is preferably enhanced to a certain level in which the level V-0 of the UL Standard is attained, for use as an electronics material.

The curing catalyst (C) used in the present invention is a curing catalyst for cyanate esters, and any well-known one can be used. Specific examples thereof include protonic acids such as hydrogen chloride, phosphoric acid and the like; Lewis acids such as aluminum chloride, a boron trifluoride complex, zinc chloride and the like; aromatic hydroxy compounds such as phenol, pyrocatechol, dihydroxynaphthalene and the like; organic metal salts such as zinc naphthenate, cobalt naphthenate, stannic octylate, cobalt octylate and the like; organometallic complexes such as copper acetylacetonate, aluminum acetylacetonate and the like; tertiary amines such as triethylamine, tributylamine, quinoline, isoquinoline, diazabicyclo[2,2,2]octane and the like; quaternary ammonium salts such as tetraethylammonium chloride, tetrabutylammonium bromide and the like; imidazoles; and sodium hydroxide, sodium methylate, triphenylphosphine and a mixture thereof.

Among these curing catalysts, organic metal salts such as zinc naphthenate, cobalt octylate, stannic octylate and the like; organic metal complexes such as copper acetylacetonate and the like; imidazoles; phenols or mixtures thereof are more preferable to attain the present objects.

The curing catalyst can be added to the resin composition at an arbitrary ratio, and they are usually blended so that the gelation time of the total resin composition is 1 minute to 15 minutes at respectively fixed temperatures of from 80° C. to 250° C.

In the resin composition of the present invention, other thermosetting resins can also be used in combination without departing from the object of the present invention. Examples thereof include bismaleimides; addition polymers of bismaleimides with diamines; alkenyl aryl ether or amine resins represented by a vinyl-benzylation product of bisphenol A and a vinyl-benzylation product of diaminodiphenyl methane; alkynyl ether or amine resins represented by a dipropargylation product of bisphenol A and a dipropargylation product of diaminodiphenyl methane; in addition, phenol resins, resol resins, aryl ether type compounds, aryl amine type compounds, isocyanates, triarylisocyanurates, polyolefin compounds containing a vinyl group, and the like, but the instant invention is not limited thereto.

If necessary, a thermoplastic resin or rubber can be also added, and examples thereof include polyphenylene ethers, polystyrenes, polyethylenes, polybutadienes, polyimides, polycarbonates, polyacrylates, polymethacrylates, and polybutadiene-acrylonitrile rubbers modified with a terminal amine or a terminal carboxyl group and a modified product thereof but are not limited thereto. The thermoplastic resin or rubber may be mixed in the cyanate ester composition, or may be used by being previously reacted with the composition.

In the present invention, known additives such as organic flame retardants, inorganic flame retardants, releasing agents, surface-treating agents, fillers and the like may be added to the composition depending upon uses.

Examples of the organic flame retardant include bromine-containing polycarbonates, bromine-containing polyphenylene oxides, bromine-containing polyacrylates, bromine-containing polystyrenes and the like, and examples of the inorganic flame retardant include antimony oxide, aluminum hydroxide, red phosphorous and the like. The releasing agent includes waxes, zinc stearate and the like, and the surface-treating agent includes a silane coupling agent and the like. The filler includes silica, alumina, talc, clays and the like.

As the polyfunctional cyanate ester compositions of the present invention can be utilized to produce a cured product that is excellent in mechanical strength, and that is particularly useful as an encapsulating material, a laminated board material, a structural material and a paint material.

EXAMPLE

Synthesis Examples of polyfunctional cyanate ester compositions and Examples of cured products thereof are illustrated below, but the present invention is not limited thereto.

Synthesis Example 1

In 500 g of water, 20 g (0.0865 mol) of 2,2-bis(4-hydroxyphenyl)propane (manufactured by Mitsui Toatsu Chemicals Inc.) and 18.25 g (0.438 mol) of 96% sodium hydroxide were homogeneously dissolved to prepare a phenolate solution, and the solution was cooled to 5° C.

Into a reactor equipped with a thermometer, a stirrer, a dropping funnel and a refluxing condenser, 100 g of water previously cooled to 0 to 5° C. was charged, and 7.97 g (0.130 mol) of cyanogen chloride was charged. The above-mentioned phenolate solution and 23.94 g (0.389 mol) of cyanogen chloride were simultaneously added dropwise in parallel into the reaction vessel over 40 minutes while keeping the temperature of the inner vessel between 0 and 10° C., and after completion of the dropwise addition, the temperature of the mixture was kept at the same temperature for 15 minutes.

Then, 200 g of methylisobutyl ketone was charged into the reaction vessel, the solution was subjected to layer-separation at 40° C., and then the organic layer was rinsed twice with 100 g of water. Then, after the organic layer was concentrated to 30 g under reduced pressure, 100 g of isopropanol was added dropwise to the concentrated organic layer, and the mixture was cooled to 2° C. and stirred for 1 hour. The slurry obtained was filtered to obtain a solid, and the resulting solid was washed with 10 g of isopropyl alcohol and dried in air to obtain 19.73 g (yield: 82%) of a white crystalline cyanate ester with a melting point of 80° C.

When the product was analyzed according to a liquid chromatography method (LC), bisphenol and a monocyanate compound of unreacted raw material were not detected. Iminocarbonates, which are produced from a side reaction were also not detected (purity: 99+%). Further, chlorine ion detected with potentiometric titration using silver nitrate was 10 ppm or less.

Synthesis Example 2

The same operation as in Synthesis Example 1 was carried out to obtain a synthesized product by using hexane in place of isopropanol described in Synthesis Example 1.

When the objective obtained composition was analyzed according to LC, bisphenol and a monocyanate compound of unreacted raw material and iminocarbonates which were produced from a side reaction were detected, and the total content thereof was 15% by weight. Further, the purity of a difunctional cyanate ester compound was 82% (by weight).

The polyfunctional cyanate esters having different contents of impurities which are used in Examples below were obtained by changing the kind of a solvent which is used in the crystallization step and washing step, after the synthesis reaction.

The specific measurement conditions of the purity of the polyfunctional cyanate ester and the respective contents of imino carbonates, alkyl cyanamides, partially substituted cyanates and phenols differ depending upon the kind of said compound. 2,2'-bis(4-cyanatophenyl)propane as indicated in Examples was measured below. LC method:

In 20 ml of acetonitrile (for high speed liquid chromatography; manufactured by Wako Pure Chemical Industries, Ltd.), 100 to 200 mg of the product obtained was dissolved, and the purity and the respective contents were determined by the peak area ratio of respective components to the total peak area (set as 100) derived from the synthesized product of a chromatogram which was obtained by the LC measurement conditions described below. LC measurement conditions:

Equipment: HITACHI L-6200 type
Guard column: SUMIPAX PG-ODS (4mmφ×4 mm)
Column: Wakosil-II 3C18HG(3 μm, 4.6 mmφ×15 cm)
Mobile phase: A liquid; 1.0% by weight aqueous solution of acetic acid (acetic acid is extra pure grade and manufactured by Wako Pure Chemical Industries, Ltd.) B liquid; acetonitrile (for LC use)
Gradient:
  Initial composition; B=50%(0 min.)
  Gradient; B=50% →(30 min.)→B=100%
  Final composition; B=100%(10 min.)
Flow rate: 1.0 ml/min.
Column temperature: 40° C.
Detection: 254 nm
Injection volume: 5 μl

Examples 1 to 6

The present Examples relate to preparation examples of cured products using polyfunctional cyanate ester compositions of the present invention.

The polyfunctional cyanate ester compositions of the invention were compounded at the compounding ratio (by weight) described in Table 1, and were melt-kneaded at 90° C. The resulting melt-kneaded mixture was poured on a casting plate made of glass plate and cured at a condition of 175° C.×2 hours to obtain a cured product with a thickness of 3 mm. A three points-bending test of the cured products was carried out. The result is shown in Table 1.

Comparative Examples 1 and 2

The polyfunctional cyanate ester compositions compounded at the compounding ratio described in Table 1 were melt-kneaded at 90° C. The resulting melt-kneaded mixture was poured on a casting plate made of glass plate and cured at a condition of 175° C.×2 hours to obtain a cured article with a thickness of 3 mm. Three points-bending test was carried out using the cured article. The result is shown in Table 1.

The strength shown in Table 1 was measured by the three points-bending test according to JIS-C-6481.

TABLE 1

| | Example | | | | | | Comparative Example | |
|---|---|---|---|---|---|---|---|---|
| | 1 | 2 | 3 | 4 | 5 | 6 | 1 | 2 |
| 2,2-bis(4-cyanatophenyl)propane Total content of impurities | | | | | | | | |
| Less than 1% | 50 | — | 50 | — | — | — | — | — |
| 2% | — | 50 | — | — | 50 | — | — | — |
| 4% | — | — | 50 | — | — | 50 | — | — |
| 15% | — | — | — | — | — | — | 50 | 50 |
| Sumiepoxy ® ESCN-195 | 50 | 50 | 50 | — | — | — | 50 | — |

TABLE 1-continued

|  | Example | | | | | | Comparative Example | |
|---|---|---|---|---|---|---|---|---|
|  | 1 | 2 | 3 | 4 | 5 | 6 | 1 | 2 |
| LDX-4127 | — | — | — | 50 | 50 | 50 | — | 50 |
| Zinc naphthenate | 0.1 | 0.1 | 0.1 | 0.1 | 0.1 | 0.1 | 0.1 | 0.1 |
| Strength (kg/mm$^2$) | 15 | 16 | 16 | 14 | 12 | 15 | 11 | 11 |

Sumiepoxy ® ESCN-195: Cresol novolac type epoxy resin (manufactured by Sumitomo Chemical Co., Ltd.)
LDX-4127: Bromine-containing novolac type epoxy resin (manufactured by Sumitomo Chemical Co., Ltd.)

The cured product of the cyanate ester composition of the present invention is excellent in mechanical property.

What is claimed is:

1. A cyanate ester composition comprising (A) a cyanate ester in which the total content of imino carbonates, alkyl cyanamides, partially substituted cyanates and phenols as impurities is 5% or less, or a prepolymer thereof, (B) an epoxy resin, and (C) a curing catalyst selected from the group consisting of a metal naphthenate and a metal octylate.

2. The cyanate ester composition according to claim 1, wherein the cyanate ester (A) is one derived from bisphenol A, or a prepolymer thereof.

3. The cyanate ester composition according to claim 1, wherein the epoxy resin (B) is an epoxy resin represented by structural formula (1) or (2) below:

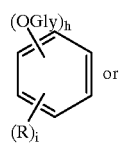
(1)

or

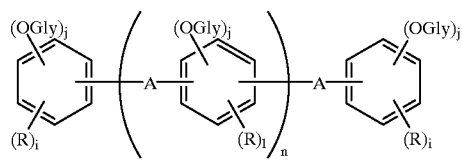
(2)

wherein, n is an average repeating number and represents a number of 0 to 10, h represents an integer of 1 to 3, j represents an integer of 1 to 3, i represents zero or an integer of 1 to 4, l is zero or integer of 1 to 3, each of the R groups independently represents a bromine atom, a chlorine atom, an alkyl group having 1 to 10 carbon atoms, a cycloalkyl group having 5 to 7 carbon atoms, a hydrocarbon group having 6 to 20 carbon atoms, which contains a cycloalkyl group having 5 to 7 carbon atoms, or a group represented by the structural formula (3) described below:

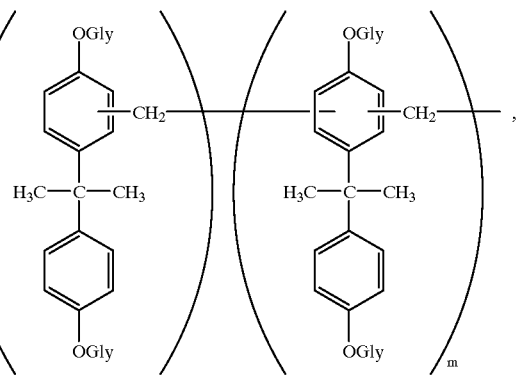
(3)

wherein m represents a number of 0 to 9, and each of the R groups may be the same or different when i is 2 or more, Gly represents a glycidyl group, and A represents an oxygen atom, a sulfur atom, or a group represented by the structural formulae (4) to (14) below:

(4)

(5)

(6)

(7)

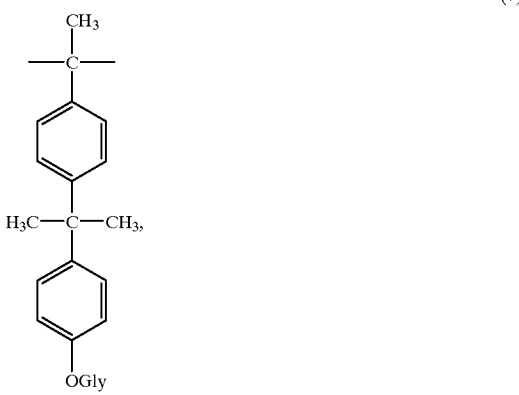
(8)

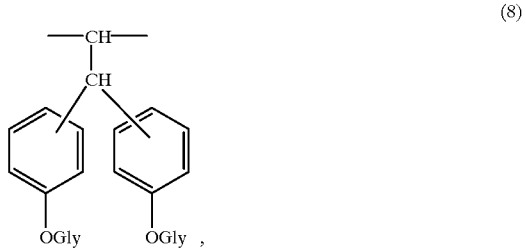
(9)

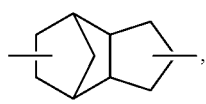

(10)

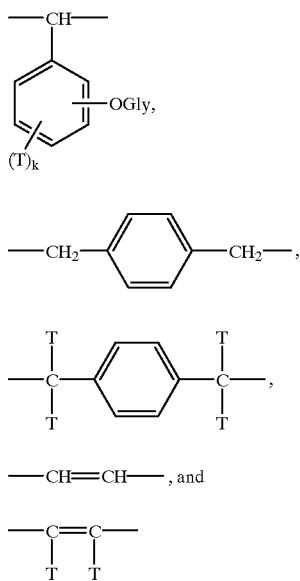

(11)

—CH₂—⌬—CH₂—, (12)

$$-\underset{T}{\overset{T}{\underset{|}{C}}}-⌬-\underset{T}{\overset{T}{\underset{|}{C}}}-,$$

(13)

—CH=CH—, and (14)

$$-\underset{T}{\overset{}{\underset{|}{C}}}=\underset{T}{\overset{}{\underset{|}{C}}}-$$

wherein each of the T groups represents an alkyl group having 1 to 10 carbon atoms, and k is zero or an integer of 1 to 4.

4. The cyanate ester composition according to claim 3, wherein the epoxy resin (B) is a reaction product of the epoxy resin, tetrabromo bisphenol A and a glycidyl ether of tetrabromo-bisphenol A.

5. The cyanate ester composition according to claim 1, wherein the curing catalyst is a metal naphthenate.

6. A cyanate ester composition comprising (A) a cyanate ester in which the total content of imino carbonates, alkyl cyanamides, partially substituted cyanates and phenols as impurities is 5% or less, or a prepolymer thereof, and (B) an epoxy resin wherein the epoxy resin (B) is an epoxy resin represented by the structural formula (15) or (16) below:

(15)

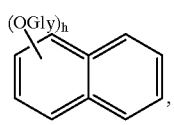

(16)

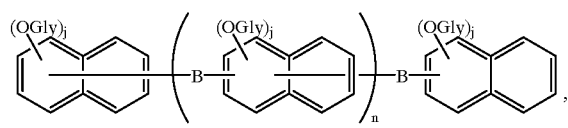

wherein n is an average repeating number and represents a number of 0 to 10, h represents an integer of 1 to 3, j represents an integer of 1 to 3, Gly represents a glycidyl group, and B represents any one of the structural formal (4) or (17) below:

(17)

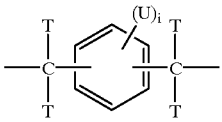

wherein each of the U groups independently represents a halogen atom or an alkyl group having 1 to 10 carbon atoms, each of the T groups represents an alkyl group having 1 to 10 carbon atoms and i represents zero or an integer of 1 to 4.

7. The cyanate ester composition according to claim 6, wherein the epoxy resin (B) is a reaction product of the epoxy resin, tetrabromo-bisphenol A and a glycidyl ether of tetrabromo-bisphenol A.

8. The cyanate ester composition according to claim 6, wherein said cyanate ester composition further contains (C) a curing catalyst selected from the group consisting of a metal naphthenate and a metal octylate.

9. The cyanate ester composition composition according to claim 8, when the curing catalyst is selected from the class of metal naphthenates.

10. The ester composition according to claim 8, wherein the curing catalyst is selected from the group consisting of zinc naphthenate, cobalt naphthenate, stannic octylate, and cobalt octylate.

11. A cured product comprising a cyanate ester composition according to claim 8, which has been cured.

12. A cured product obtained by curing the cyanate ester composition of claim 1.

13. A cured product obtained by curing the cyanate ester composition of claim 2.

14. A cured product obtained by curing the cyanate ester composition of claim 3.

15. A cured product obtained by curing the cyanate ester composition according to claim 4.

16. A cured product obtained by curing the cyanate ester composition according to claim 6.

17. A cured product obtained by curing the cyanate ester composition according to claim 7.

* * * * *